US012185499B2

(12) United States Patent
Enright et al.

(10) Patent No.: US 12,185,499 B2
(45) Date of Patent: Dec. 31, 2024

(54) OSCILLATING HEAT PIPE

(71) Applicant: Nokia Technologies Oy, Espoo (FI)

(72) Inventors: Ryan Enright, Floral Park, NY (US); Raffaele Luca Amalfi, New Providence, NJ (US)

(73) Assignee: Nokia Technologies Oy, Espoo (FI)

( * ) Notice: Subject to any disclaimer, the term of this patent is extended or adjusted under 35 U.S.C. 154(b) by 321 days.

(21) Appl. No.: 17/525,012

(22) Filed: Nov. 12, 2021

(65) Prior Publication Data

US 2022/0167529 A1 May 26, 2022

(30) Foreign Application Priority Data

Nov. 20, 2020 (EP) .................................... 20208922

(51) Int. Cl.
*H05K 7/20* (2006.01)
*F28D 15/02* (2006.01)
(Continued)

(52) U.S. Cl.
CPC ..... *H05K 7/20336* (2013.01); *F28D 15/0241* (2013.01); *F28D 15/0266* (2013.01);
(Continued)

(58) Field of Classification Search
CPC .. F28D 15/0241; F28D 15/0266; F28D 15/06; G06F 1/1616; G06F 1/203; H05K 7/20327; H05K 7/20336; H05K 7/2099
See application file for complete search history.

(56) References Cited

U.S. PATENT DOCUMENTS 3,299,908 A * 1/1967 Petzetakis ............... B29C 48/18
138/122
3,526,692 A * 9/1970 Onaka ..................... B29C 48/21
264/171.12
(Continued)

FOREIGN PATENT DOCUMENTS

CN 201522215 U 7/2010
CN 102169857 A 8/2011
(Continued)

OTHER PUBLICATIONS

Mochizuki et al., "Hinged heat pipes for cooling notebook PCs", Thirteenth Annual IEEE. Semiconductor Thermal Measurement and Management Symposium, Jan. 28-30, 1997, pp. 64-72.
(Continued)

*Primary Examiner* — Robert J Hoffberg
(74) *Attorney, Agent, or Firm* — Harrington & Smith (57) ABSTRACT

Examples of the disclosure relate to an oscillating heat pipe comprising for cooling components within a bendable electronic device. The oscillating heat pipe comprises at least one condenser region to be positioned in a first portion of the bendable electronic device and at least one evaporator region to be positioned in a second portion of the bendable electronic device. The oscillating heat pipe also comprises at least one bendable region provided between the condenser region and the evaporator region and configured to extend across a hinge of a bendable electronic device wherein at least one bendable region comprises a polymer tubing supported by a flexible helical support structure.

20 Claims, 8 Drawing Sheets

(51) Int. Cl.
  *F28D 15/06* (2006.01)
  *G06F 1/16* (2006.01)
  *G06F 1/20* (2006.01)
(52) U.S. Cl.
  CPC ........... *F28D 15/06* (2013.01); *G06F 1/1616* (2013.01); *G06F 1/203* (2013.01); *H05K 7/20327* (2013.01); *H05K 7/2099* (2013.01)

(56) References Cited

U.S. PATENT DOCUMENTS

| | | | | |
|---|---|---|---|---|
| 3,604,503 | A * | 9/1971 | Feldman, Jr. | F28D 15/06 165/274 |
| 3,604,504 | A * | 9/1971 | Kessler, Jr. | F28D 15/046 165/46 |
| 4,947,825 | A * | 8/1990 | Moriarty | B64G 1/506 165/104.11 |
| 5,343,940 | A * | 9/1994 | Jean | H01L 23/427 165/80.4 |
| 5,910,883 | A | 6/1999 | Copolla et al. | |
| 6,250,378 | B1 * | 6/2001 | Kobayashi | F28D 15/0266 361/679.52 |
| 6,269,865 | B1 * | 8/2001 | Huang | F28D 15/0266 174/15.2 |
| 6,672,373 | B2 * | 1/2004 | Smyrnov | F28D 15/0266 174/15.2 |
| 6,741,464 | B2 * | 5/2004 | Kitano | G06F 1/203 174/15.2 |
| 6,987,668 | B2 * | 1/2006 | Kitano | G06F 1/203 361/679.55 |
| 7,345,877 | B2 * | 3/2008 | Asfia | F28D 15/0266 361/720 |
| 8,069,907 | B2 * | 12/2011 | Bryant | F28D 15/04 361/679.52 |
| 8,422,218 | B2 * | 4/2013 | Fried | H05K 7/20809 361/695 |
| 9,261,310 | B2 * | 2/2016 | Fried | F28D 15/0266 |
| 9,863,712 | B2 * | 1/2018 | Anderl | F28F 21/085 |
| 10,080,315 | B2 * | 9/2018 | Agostini | H05K 7/20936 |
| 10,088,879 | B2 | 10/2018 | Jin et al. | |
| 10,126,070 | B2 * | 11/2018 | Anderl | F28D 15/046 |
| 10,156,403 | B2 * | 12/2018 | Anderl | F28D 15/0283 |
| 10,458,727 | B2 * | 10/2019 | Gregory | F24D 3/146 |
| 10,595,439 | B2 * | 3/2020 | Shia | H01L 23/427 |
| 11,815,315 | B2 * | 11/2023 | Liu | F28D 15/0241 |
| 2001/0022720 | A1 | 9/2001 | Mitchell | |
| 2003/0037909 | A1 * | 2/2003 | Smyrnov | F28D 15/0233 165/104.21 |
| 2004/0008489 | A1 * | 1/2004 | Minamitani | G06F 1/203 361/699 |
| 2005/0180109 | A1 | 8/2005 | Miyazaki et al. | |
| 2008/0073066 | A1 * | 3/2008 | Chang | F28D 15/0233 165/104.21 |
| 2008/0092973 | A1 * | 4/2008 | Lai | F16L 11/118 138/118 |
| 2008/0253082 | A1 * | 10/2008 | Lev | G06F 1/203 361/679.46 |
| 2009/0323276 | A1 * | 12/2009 | Mongia | G06F 1/203 361/679.52 |
| 2011/0067843 | A1 * | 3/2011 | Vasiliev, Jr. | H01L 23/427 165/104.26 |
| 2011/0088874 | A1 * | 4/2011 | Meyer, IV | F28D 15/046 165/104.26 |
| 2011/0220328 | A1 | 9/2011 | Huang et al. | |
| 2013/0048248 | A1 * | 2/2013 | Lin | F28D 15/046 29/890.032 |
| 2017/0234623 | A1 * | 8/2017 | Fried | H05K 7/20809 165/104.26 |
| 2018/0031329 | A1 * | 2/2018 | Wang | F28D 15/046 |
| 2018/0080720 | A1 | 3/2018 | Anderl et al. | |
| 2018/0299206 | A1 | 10/2018 | Kim et al. | |
| 2019/0354148 | A1 * | 11/2019 | Delano | G06F 1/203 |
| 2020/0279989 | A1 * | 9/2020 | Sperry | H10N 10/17 |
| 2021/0254899 | A1 * | 8/2021 | Alahyari | F28D 15/0266 |
| 2023/0269909 | A1 * | 8/2023 | Grillanda | G01S 7/003 372/35 |
| 2024/0053108 | A1 * | 2/2024 | Enright | G06F 1/203 |
| 2024/0200880 | A1 * | 6/2024 | Duong | F28F 27/02 |
| 2024/0275871 | A1 * | 8/2024 | Zhang | G06F 1/1681 |

FOREIGN PATENT DOCUMENTS

| | | | | |
|---|---|---|---|---|
| CN | 107912008 | A * | 4/2018 | ......... H05K 7/20336 |
| CN | 113660833 | A * | 11/2021 | ......... H05K 7/20318 |
| JP | H1195873 | A | 4/1999 | |
| JP | 2006010106 | A * | 1/2006 | ............ F28D 15/02 |
| JP | 2015111189 | A * | 6/2015 | |
| TW | 425501 | B * | 3/2001 | |

OTHER PUBLICATIONS

"Silicone Extrusion & GeoTrans™", Trelleborg, Retrieved on Oct. 21, 2021, Webpage available at : https://www.trelleborg.com/en/healthcare/products-capabilities/custom-shapes/geotrans-silicone-extrusion.

Chiriac et al., "A figure of merit for mobile device thermal management", 15th IEEE Intersociety Conference on Thermal and Thermomechanical Phenomena in Electronic Systems (ITherm), May 31-Jun. 3, 2016, pp. 1393-1397.

Wang et al., "Tube Bending Under Axial Force and Internal Pressure", The Journal of Manufacturing Science and Engineering, vol. 128, No. 2, May 2006, pp. 598-605.

Nematollahisarvestani et al., "Design of Thermal Ground Planes for Cooling of Foldable Smartphones", Journal of Electronic Packaging, 2019, pp. 1-24.

Senjaya et al., "Effects of non-condensable gas on the performance of oscillating heat pipe, part I: Theoretical study", Applied Thermal Engineering, vol. 73, No. 1, Dec. 5, 2014, pp. 1-6.

Senjaya et al., "Effects of non-condensable gas on the performance of oscillating heat pipe, part II: Experimental study", Applied Thermal Engineering, vol. 73, No. 1, Dec. 5, 2014, pp. 1-8.

Daimaru et al., "Operational Characteristics of the Oscillating Heat Pipe with Noncondensable Gas", Journal of Thermophysics and Heat Transfer, vol. 29, No. 3, Jul.-Sep. 2015, pp. 563-571.

Merkel et al., "Gas sorption, diffusion, and permeation in poly(dimethylsiloxane)", Journal of Polymer Science: Part B: Polymer Physics, vol. 38, 2000, pp. 415-434.

Miyazaki, "Cooling of Notebook Pcs by Flexible Oscillating Heat Pipes", International Electronic Packaging Technical Conference and Exhibition, 2005, pp. 1-5.

Extended European Search Report received for corresponding European Patent Application No. 20208922.3, dated Apr. 20, 2021, 8 pages.

"Heat pipe", Wikipedia, Retrieved on Jan. 19, 2024, Webpage available at : https://en.wikipedia.org/wiki/Heat_pipe.

Notice of Allowance received for corresponding European Patent Application No. 20208922.3, dated Dec. 22, 2023, 8 pages.

* cited by examiner

OSCILLATING HEAT PIPE

TECHNOLOGICAL FIELD

Examples of the disclosure relate to oscillating heat pipes. Some relate to oscillating heat pipes for use in bendable electronic devices.

BACKGROUND

Hinged or otherwise bendable electronic devices are known. Such devices comprise components such as processors which generate unwanted levels of heat. Therefore, components that enable distribution of this heat are useful.

BRIEF SUMMARY

According to various, but not necessarily all, examples of the disclosure there is provided an heat pipe comprising: at least one condenser region configured to be positioned in a first portion of a bendable electronic device; at least one evaporator region configured to be positioned in a second portion of a bendable electronic device; and at least one bendable region provided between the condenser region and the evaporator region and configured to extend across a hinge of a bendable electronic device wherein the at least one bendable region comprises a polymer tubing supported by a flexible helical support structure.

The flexible helical support structure may comprise at least one of; metal, metal alloy, polymer.

The evaporator region may be configured to be thermally coupled to at least one of; an electronic component, a vapour chamber, a heat spreader, a solid-state heat spreader, a heat pipe.

The at least one condenser region may be configured to be thermally coupled to at least one of; a heat spreader, a vapour chamber.

Working fluid within the heat pipe may have a confinement number less than one.

Working fluid within the heat pipe may comprise fluorine.

Working fluid within the heat pipe may have a vapour pressure high enough to reduce effects of ingress of non-condensable gases into the heat pipe.

The at least one bendable region of the heat pipe may be formed from a polymer selected to reduce interaction with working fluid in the heat pipe.

The condenser region and the evaporator region of the heat pipe may comprise rigid materials.

The heat pipe may comprise at least one reservoir coupled to the heat pipe and configured to store working fluid for refilling the heat pipe.

The at least one sensor configured to sense a filling level of the working fluid within the heat pipe and at least one controller configured to control refilling of the heat pipe from the reservoir based on a signal from the at least one sensor.

The first portion of the bendable electronic device may be a rigid portion and the second portion of the bendable electronic device may be a rigid portion and the bendable region of the heat pipe may be provided across a hinge between the two rigid portions.

The first portion of the bendable electronic device may comprise a display.

The second portion of the bendable electronic device may comprise at least one of; battery, processor.

According to various, but not necessarily all, examples of the disclosure there is provided a bendable electronic device comprising one or more heat pipes as described in any preceding paragraph.

Herein, the terms "oscillating heat pipe, and "heat pipe" may be used interchangeably while they both refer to the same object.

BRIEF DESCRIPTION

Some examples will now be described with reference to the accompanying drawings in which.

DETAILED DESCRIPTION

Examples of the disclosure relate to an oscillating heat pipe 101 that is configured for use in a hinged or otherwise bendable electronic device 201. The oscillating heat pipe 101 comprises at least one bendable region that is configured to extend across a hinge of the bendable electronic device.

Figure 1:
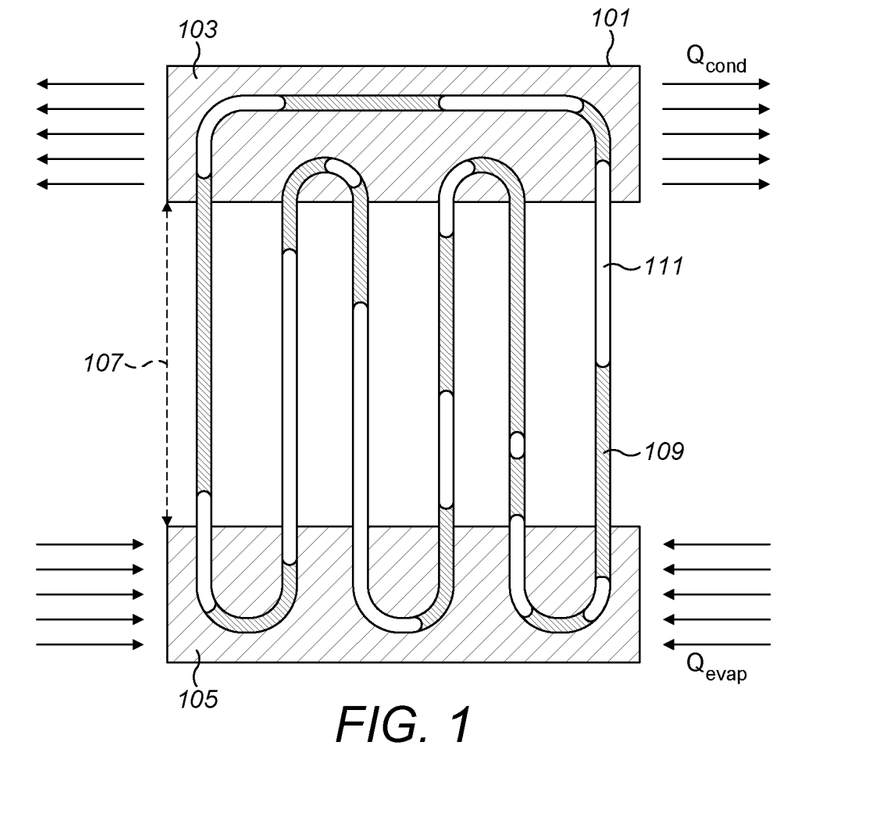
FIG. 1 shows an oscillating heat pipe.

FIG. 1 schematically shows an oscillating heat pipe 101. The oscillating heat pipe 101 comprises a condenser region 103, an evaporator region 105 and an adiabatic section 107.

The evaporator region 105 comprises any means for transferring heat from a heat source into working fluid within the oscillating heat pipe 101. The evaporator region 105 is thermally coupled to a heat source. The heat source could be an electronic component that generates unwanted heat during use of a bendable electronic device such as a battery or processing unit. In some examples the heat source could be a vapour chamber comprising a wick structure or heat pipe that could be thermally coupled between the oscillating heat pipe 101 and one or more electronic components.

The condenser region 103 comprises any means for transferring heat out of the working fluid within the oscillating heat pipe 101. The condenser region 103 is thermally coupled to a heat sink, a vapour chamber or any other suitable type of means for transferring heat out of the working fluid.

The oscillating heat pipe 101 is configured in a meandering or serpentine configuration comprising a plurality of bends. A first plurality of bends are located in the evaporator region 105 and a second plurality of bends are located in the condenser region 103. In the example shown in FIG. 1 three U-shaped bends are shown in the evaporator region 105 and two U-shaped bends are shown in the condenser region 103. Other configurations and numbers of bends could be used in other examples of the disclosure. The meandering or serpentine configuration is configured so that the working fluid within the oscillating heat pipe 101 is alternately heated in the evaporator region 105 and cooled in the condenser region 103 of the oscillating heat pipe 101.

In the example shown in FIG. 1 the oscillating heat pipe 101 forms a closed loop. Other types of oscillating heat pipe 101 could be used in other examples of the disclosure.

The oscillating heat pipe 101 has a diameter that is small enough to enable liquid slugs 109 and vapour plugs 111 to be formed within the working fluid. The diameter of the oscillating heat pipe 101 that enables the formation of liquid slugs 109 and vapour plugs 111 will depend upon the type of working fluid that is used and the properties of the working fluid such as surface tension, liquid density, vapour density or any other suitable property.

In the example shown in FIG. 1 an adiabatic section 107 is provided between the evaporator region 105 and the condenser region 103. The adiabatic section 107 extends between the bends in the condenser region 103 and the bends in the evaporator region 105. The adiabatic section 107 ensures that heat that is transferred into the working fluid in the evaporator region 105 is retained within the oscillating heat pipe 101 until the working fluid reaches the condenser region 103. In some examples the oscillating heat pipe 101 does not comprise an adiabatic section 107. Whether or not the oscillating heat pipe 101 comprises an adiabatic section 107 can depend on the application and system geometry of the oscillating heat pipe 101 and any other suitable factors.

When the oscillating heat pipe 101 is in use heat is applied to the working fluid in the bends within the evaporator region 105. This heat causes, at least some of, the working fluid to evaporate. This evaporation results in an increase of vapour pressure inside the oscillating heat pipe 101 which causes the growth of bubbles within the evaporator region 105. The growth of the bubbles and the increase in vapour pressure forces liquid slugs 109 of the working fluid towards the condenser region 103. The working fluid that is pushed to the condenser region 103 is then cooled by the condenser. This cooling reduces the vapour pressure within the working fluid and causes condensation of the bubbles and provides a restoring force that pushes the working fluid back towards the evaporator region 105. This process of alternate bubble growth and condensation causes oscillation of the working fluid within the oscillating heat pipe 101 and allows for the transfer of heat between the evaporator region 105 and the condenser region 103.

The oscillating heat pipe 101 does not use a wick structure and so can be simple to manufacture and can be configured to transfer more heat compared to a heat pipe or a vapour chamber comprising a wick structure.

The oscillating heat pipe 101 is configured so that it can function in any orientation. That is, the movement of the fluid within the oscillating heat pipe 101 is not dependent upon gravity. This makes the oscillating heat pipe 101 suitable for use in portable electronic devices which could be used in different orientations.

Figure 2A:
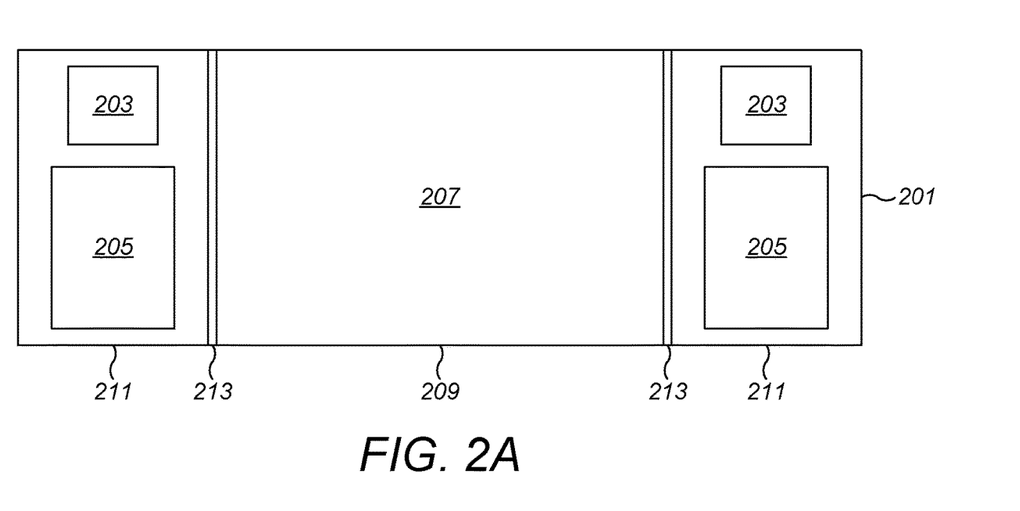
FIGS. 2A to 2C show a bendable electronic device.
Figure 2B:
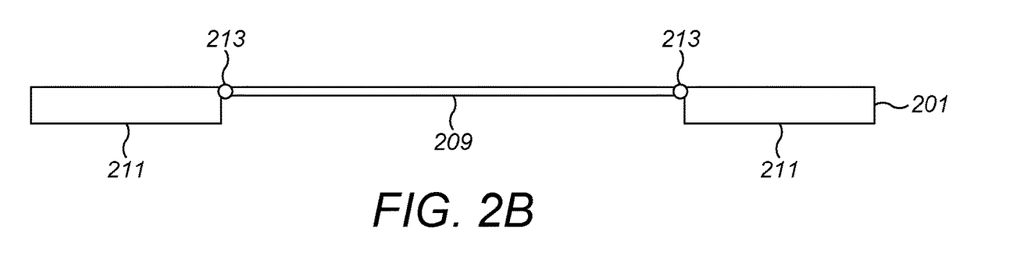
Figure 2C:
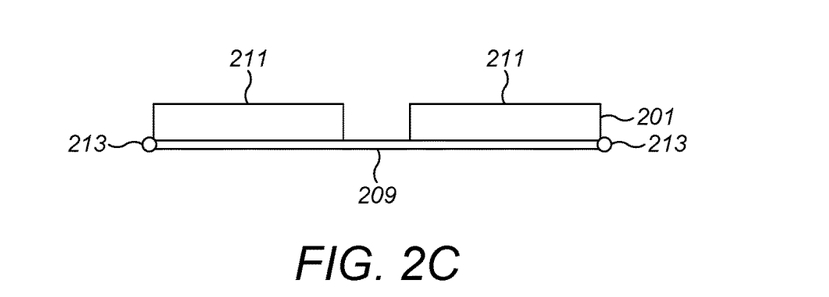

FIGS. 2A to 2C show an example of a bendable electronic device 201 that could comprise one or more oscillating heat pipes 101 according to examples of the disclosure. FIG. 2A shows a front view of the bendable electronic device 201 in an unfolded configuration, FIG. 2B shows a side view of the bendable electronic device 201 in an unfolded configuration and FIG. 2C shows an end view of the bendable electronic device 201 in a folded configuration.

The bendable electronic device 201 can be a portable electronic device such as a mobile phone, tablet, laptop or any other suitable electronic device. The bendable electronic device 201 can be used for wireless communications or for any other suitable purpose.

In the example shown in FIGS. 2A to 2C the bendable electronic device 201 comprises a rigid central portion 209 and two rigid end portions 211. The rigid end portions 211 are coupled to the sides of the rigid central portion 209 via hinges 213. The rigid portions 209, 211 are rigid in that they cannot be easily deformed by a user applying normal forces. The rigid portions 209, 211 do not bend during normal use of the bendable electronic device 201. The rigid portions 209, 211 can house electronic components which enable the bendable electronic device 201 to function. The rigid portions 209, 211 can house electronic components that are not flexible and/or that could be damaged if they were bent or otherwise deformed.

The hinges 213 can comprise any means that enable the rigid end portions 211 to be moved between folded and unfolded configurations. In the unfolded configurations the hinges 213 are opened and the rigid end portions 211 are positioned adjacent to the rigid central portion 209 so that a surface of the rigid central portion 209 forms a substantially planar surface with the surfaces of the rigid end portions 211. In the folded configuration the hinges 213 are closed and the rigid end portions 211 are provided overlaying the surface of the rigid central portion 209 so that the rigid end portions 211, at least partially, covers the surface of the rigid central portion 209.

It is to be appreciated that other configurations of a bendable electronic device 201 could be used in other examples of the disclosure. For instance, the hinges 213 could be configured so that in the folded configuration the rigid end portions 211 are positioned underneath the rigid central portion 209 rather than overlaying the rigid central portion 209.

In the example shown in FIGS. 2A to 2C the bendable electronic device 201 comprises three different rigid portions 209, 211 and two hinges 213 between the different rigid portions. In other examples the bendable electronic device 201 could comprise a different number of rigid portions. For example, the bendable electronic device 201 could comprise two rigid portions with a hinge between them or could comprise more than three rigid portions.

The rigid portions 209, 211 can house any suitable electronic components. In the example shown in FIGS. 2A to 2C a processor unit 203 and a power source 205, such as a battery, are positioned in each of the rigid end portions 211 of the bendable electronic device 201. A display 207 is provided in the rigid central portion 209. Interconnects can be provided between the electronic components in the respective rigid portions 209, 211 of the bendable electronic device 201. This can enable control signals from the processor units 203 to be exchanged with the display 207 and can enable power from the power source 205 to be provided to the display 207.

When the bendable electronic device 201 is in use the components in the rigid end portions 211 such as the processor units 203 the power source 205 can generate unwanted heat. The central rigid portion 209 has a larger surface area that can be used for heat rejection. Therefore in examples of the disclosure an oscillating heat pipe 101 is provided which can transfer heat from the electronic components 203, 205 in the rigid end portions 211 to a heat sink in the central rigid portion 209.

Figure 3:
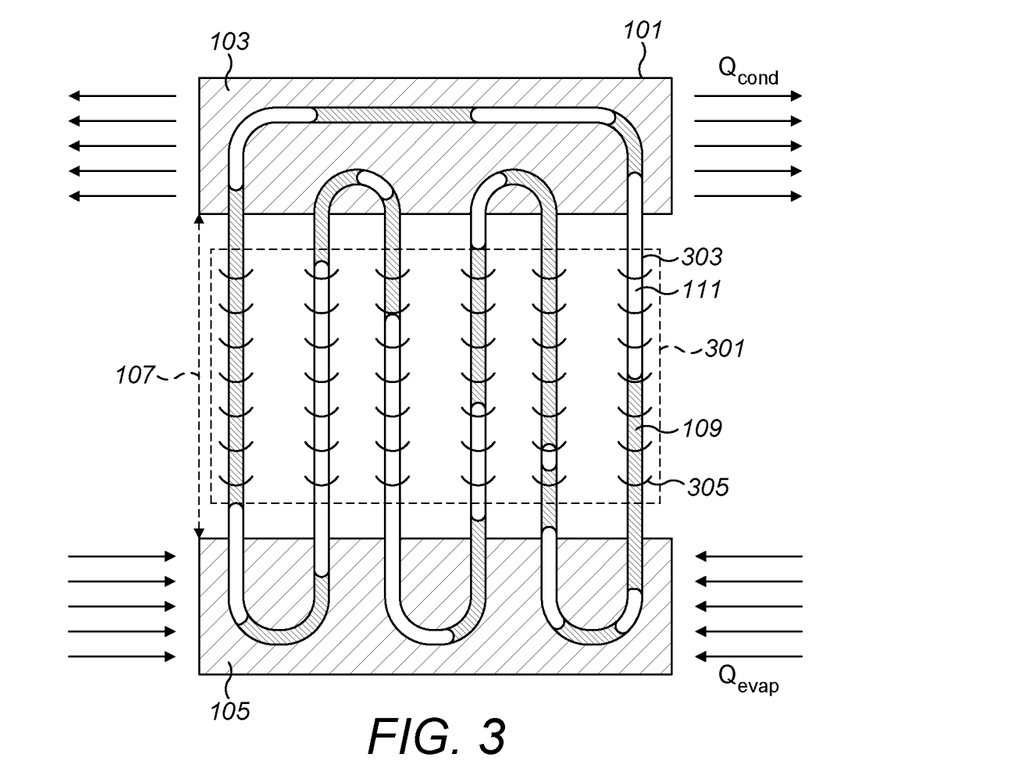
FIG. 3 shows an oscillating heat pipe for use in a bendable electronic device.

FIG. 3 schematically shows an oscillating heat pipe 101 that can be used in a bendable electronic device 201. The oscillating heat pipe 101 could be used in a bendable electronic device 201 as shown in FIGS. 2A to 2C or any other bendable electronic device 201 comprising two or more rigid portions 209, 211 and a hinge 213.

The oscillating heat pipe 101 comprises a condenser region 103, an evaporator region 105 and a bendable region 301.

The condenser region 103 is thermally coupled to a heat sink to allow for heat transfer out of the oscillating heat pipe 101. The heat sink could be a heat spreader, a vapour chamber or any other suitable means for removing heat from the oscillating heat pipe 101.

The condenser region 103 is configured to be positioned in a first portion of a bendable electronic device 201. The condenser region 103 could be positioned within the rigid central portion 209 of the bendable electronic device 201 shown in FIGS. 2A to 2C. In such examples one or more heat sinks could be provided within the rigid central portion 209.

The evaporator region 105 is thermally coupled to one or more heat sources to allow for heat transfer into the oscillating heat pipe 101. The heat source could be one or more electronic components, one or more vapour chambers or any other suitable source of heat. In some examples the evaporator region 105 could be thermally coupled to a single heat source. In other examples the evaporator region 105 could be thermally coupled to a plurality of different heat sources.

The evaporator region 105 is configured to be positioned in second portion of a bendable electronic device 201. The second portion of the bendable electronic device 201 is a different portion to the first portion in which the condenser region 103 is located. For instance, the evaporator region 105 could be positioned within either of the rigid end portions 211 of the bendable electronic device 201 shown in FIGS. 2A to 2C. In such examples the evaporator region 105 could be thermally coupled to the processor units 203 and/or power sources 205.

The oscillating heat pipe 101 also comprises a bendable region 301. The bendable region 301 in indicated in the dashed lines in FIG. 3. The bendable region 301 is provided between the condenser region 103 and the evaporator region 105. In the example shown in FIG. 3 the bendable region 301 is shown in the dashed lines. The bendable region 301 can be provided within the adiabatic section 107 of the oscillating heat pipe 101.

The bendable region 301 of the oscillating heat pipe 101 is configured to extend a across a hinge 213 of the bendable electronic device 201. When the oscillating heat pipe 101 is positioned within a bendable electronic device 201 the bendable region 301 of the oscillating heat pipe 101 is located across the hinge so that the bendable region 301 can bend and straighten as the hinge 213 is opened and closed.

In the example shown in FIG. 3 the oscillating heat pipe 101 is shown in a straight or unfolded configuration. It is to be appreciated that the bendable region 301 allows for the bending of the oscillating heat pipe 101 so that, during use, the bending of the bendable region 301 allows for movement of the condenser region 103 relative to the evaporator region 105.

The bendable region 301 comprises a flexible structure. The bendable region 301 can comprise a polymer tubing 303 supported by a flexible helical support structure 305. An example of the polymer tubing 303 and flexible helical support structure 305 that can be used is shown in more detail in FIGS. 6A to 6B.

In examples of the disclosure different sections of the oscillating heat pipe 101 can be formed from different materials. For instance, the bendable region 301 of the oscillating heat pipe 101 can be formed from flexible materials such as a polymer while the evaporator region 105 and the condenser region 103 can comprise rigid materials. This can enable the bendable region 301 of the oscillating heat pipe 101 to be folded and unfolded during use while the rigid condenser region 103 and evaporator region 105 do not bend or otherwise deform during use.

The rigid materials that are used for the evaporator region 105 and the condenser region 103 can be selected based on heat transfer properties so as to ensure good heat transfer between the oscillating heat pipe 101 and the components of the bendable electronic device 201. In some examples the rigid evaporator region 105 can also function as a stiffener to help to reduce bending of portions of the electronic device 201. For example, it could help to reduce bending of a display or other similar components.

The different materials for the different sections of the oscillating heat pipe 101 can be joined together using any suitable means. For example, a bayonet connection or other mechanical type of connection could be used. In some examples an adhesive or other chemical connection could be used. The join between the different sections are sufficiently strong with respect to the internal pressure of the working fluid within the oscillating heat pipe 101 and the axial tensile forces that are generated when the oscillating heat pipe 101 is folded and unfolded. The join can be located within one of the rigid portions 209, 211 of the bendable electronic device so as to reduce forces on the join when the bendable electronic device 201 is opened and closed.

Figure 4:
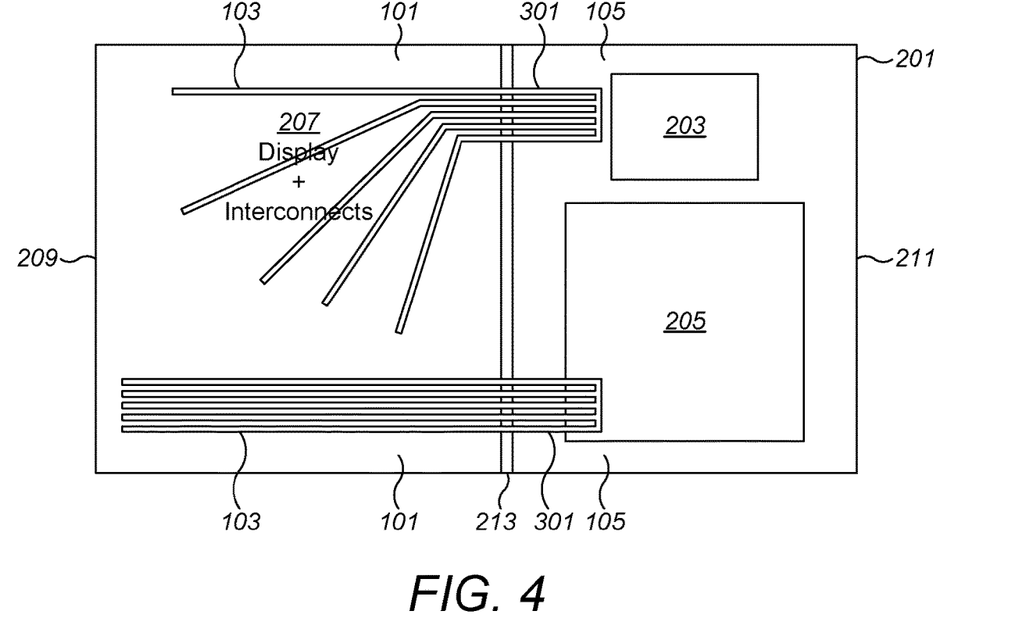
FIG. 4 shows oscillating heat pipes in a bendable electronic device.

FIG. 4 shows example oscillating heat pipes 101 in a bendable electronic device 201. FIG. 4 shows part of the bendable electronic device 201 as shown in FIGS. 2A to 2C. In FIG. 4 part of the central rigid portion 209 and part of a rigid end portion 211 are shown together with the hinge 213 that connects the rigid portions 209, 211. It is to be appreciated that a similar arrangement of oscillating heat pipes 101 could be provided in the other rigid end portion 211. It is also to be appreciated that other arrangements of oscillating heat pipes 101 could be used in other example bendable electronic devices 201.

In the example of FIG. 4 two oscillating heat pipes 101 are provided, at least partially, within the rigid end portion 211. A first oscillating heat pipe 101 is shown with an evaporator region 105 located adjacent to the processor unit 203 so that heat from the processor unit 203 can be transferred into the working fluid in the evaporator region 105. A second oscillating heat pipe 101 is shown with an evaporator region 105 located adjacent to the power source 205 so that heat from the power source can be transferred into the working fluid in the evaporator region 105 of the second oscillating heat pipe 101. In some examples the oscillating heat pipes 101 can be thermally connected to heat spreaders such as vapour chambers, heat pipes, solid state spreaders or other suitable means. The heat spreaders could comprise a graphite sheet or thermally conductive metal or ceramic or any other suitable means. These can enable the oscillating heat pipes 101 to be thermally coupled to the heat sources such as the processor unit 203 and power source 205.

As the evaporator regions 105 are located on the rigid end portion 211 they do not bend or otherwise deform and the bendable electronic device 201 is moved between a folded and unfolded configuration. Therefore the evaporator regions 105 can comprise rigid materials.

The bendable regions 301 of the oscillating heat pipes 101 extend over the hinge 213 so that when the hinge 213 is opened and closed the bendable region 301 moves between an unfolded and folded configuration. In the example shown in FIG. 4 the bendable electronic device 201 is shown in an unfolded configuration in which the rigid end portion 211 is positioned adjacent to the central rigid portion 209. The bendable region 301 of the oscillating heat pipe 101 is therefore also provided in an unfolded configuration.

The condenser regions 103 of the oscillating heat pipes 101 are provided on the central rigid portion 209. The condenser regions 103 can be coupled to heat sinks, vapour chambers, heat pipes or any other suitable means for transferring heat out of the oscillating heat pipe 101. The heat sink could comprise a fixed heat spreader such as a metallic structure, a graphite sheet or any other suitable heat spreading means.

The first oscillating heat pipe 101 comprises a plurality of condenser regions 103. In this example the plurality of condenser regions 103 are spread across the central rigid portion 209. This enables a larger surface area to be used to dissipate the heat and can enable the heat to be transferred out of the oscillating heat pipe 101 more effectively.

The second oscillating heat pipe 101 can comprise condenser regions 103 that are in different locations to the condenser regions 103 of the first oscillating heat pipe 101. This can enable the heat sinks that are used for the second oscillating heat pipe 101 to be spread out from the heat sinks that are used for the first oscillating heat pipe 101 and so can make the heat transfer more efficient because the dominant limiting factor of the thermal resistance of the oscillating heat pipe 101 may be the thermal resistance of the condenser regions 103. Spreading the condenser regions 103 over a large area allows for higher heat rejection by the condenser regions 103.

Figure 5A:
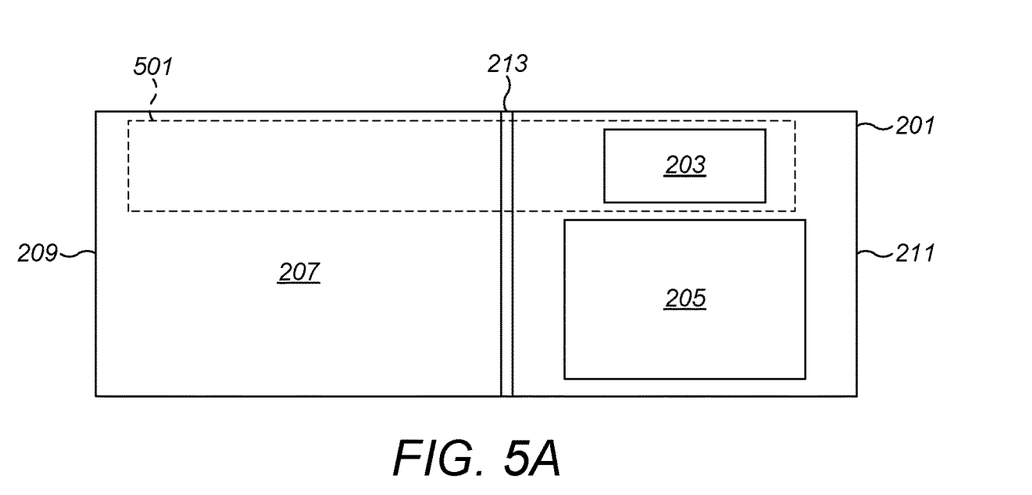
FIGS. 5A and 5B show an oscillating heat pipe in a bendable electronic device.
Figure 5B:
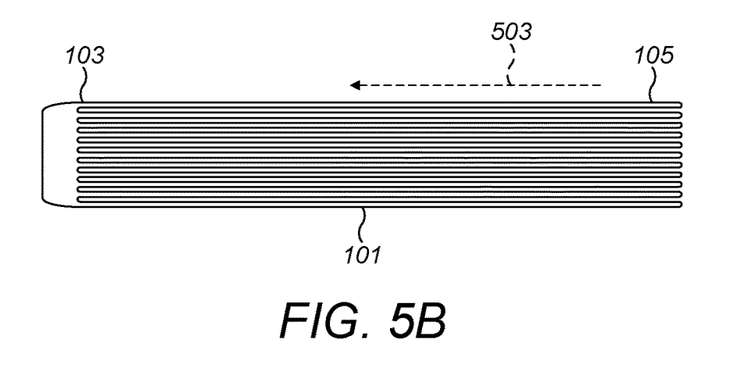

FIGS. 5A and 5B schematically show an oscillating heat pipe 101 that can be used in a bendable electronic device 201.

FIG. 5A shows part of the bendable electronic device 201 as shown in FIG. 2. In FIG. 5A part of the central rigid portion 209 and part of a rigid end portion 211 are shown together with the hinge 213 that connects the rigid portions 209, 211. The oscillating heat pipe 101 that could be used in this bendable electronic device 201 is shown in FIG. 5B. The dashed lines 501 in FIG. 5A indicate where the oscillating heat pipe 101 would be located within the bendable electronic device 201. The oscillating heat pipe 101 would be located so that the evaporator region 105 is located close to the processor unit 203 in the rigid end portion 211 and the condenser region 103 is located close to a heat sink in the central rigid portion 209. The dashed arrow 503 indicates the direction in which heat is transferred.

Table 1 shows example geometrical parameters that could be used for the oscillating heat pipe 101 shown in FIGS. 5A and 5B:

TABLE 1

| | |
|---|---|
| Working fluid | R236fa |
| Filling ratio | 50% |
| Evaporator area | 12 × 12 (mm²) |
| Condenser area | 12 × 40 (mm²) |
| Channel diameter | 0.4(mm) |
| Number or turns | 15 |

Table 2 shows the thermal performance that can be achieved with an oscillating heat pipe 101 having these parameters.

TABLE 2

| | |
|---|---|
| Thermal resistance | 4.3(K/W) |
| Junction temperature | 50(° C.) |

TABLE 2-continued

| | |
|---|---|
| Device skin temperature | 40(° C.) |
| Air temperature | 20(° C.) |
| Cooling capacity | ≈7 (W) |

The oscillating heat pipe 101 can function without the aid of gravity and this can enable the oscillating heat pipe 101, and any devices that the oscillating heat pipe 101 is incorporated in, to be operable in any orientation. In some examples the thermal performance of the oscillating heat pipe 101 can be improved by orientating the oscillating heat pipe 101 so that the movement of the working fluid through the oscillating heat pipe 101 is assisted by gravity. In such examples a user could obtain enhanced thermal performance of their bendable electronic device 201 by holding the bendable electronic device 201 in a particular orientation. The orientation could be determined using an accelerometer or any other suitable means.

The working fluid in the oscillating heat pipe 101 can be selected so as to reduce or minimize the diameter for the oscillating heat pipe 101. In such examples the working fluid that is used within the oscillating heat pipe 101 can be selected to have a small confinement number. In some examples the working fluid is selected to have a confinement number less than one. The suggested confinement number can be between 0.8 and 1.

The confinement number is given by:

$$Co = l_c/2r_i,$$

where $l_c = \sqrt{\gamma/(g\Delta\rho)}$ is the capillary length, $\gamma$ is the working fluid surface tension, g is the acceleration due to gravity, $\Delta\rho$ is the density difference between the liquid and vapour phase of the working fluid and $r_i$ is the inner radius of the oscillating heat pipe 101.

Having a small confinement number, for example a confinement number below one, reduces the impact of surface tension related instabilities on the functioning of the oscillating heat pipe 101.

The working fluid that is used within the oscillating heat pipe 101 can comprise fluorine. For example, the working fluid could be R236fa, R1233zd, R245fa or any other suitable working fluid. Such working fluids have characteristically small $\gamma$ and large $\Delta\rho$ and so provide low confinement numbers. Such working fluids are dielectric and may have low global warming potential (GWP) values. The oscillating heat pipe 101 would require a small amount of the working fluid to properly operate, for example, less than 1 g.

The oscillating heat pipe 101 can be configured to reduce or minimise the effects of ingress of non-condensable gases from the atmosphere into the oscillating heat pipe 101. The non-condensable gases, such as oxygen and nitrogen could diffuse across the polymer of the bendable region 301 of the oscillating heat pipe 101. Such gases would degrade the performance of the oscillating heat pipe 101. In some examples the oscillating heat pipe 101 could comprise a diffusion barrier which could restrict the ingress of the non-condensable gases.

In some examples the working fluid that is used within the oscillating heat pipe 101 is configured to have a vapour pressure that is high enough to reduce effects of ingress of non-condensable gases into the oscillating heat pipe 101. The working fluid can be selected to have a high vapour pressure (low boiling point) so that if the concentration of non-condensable gases within the oscillating heat pipe 101 is equilibrated with the external pressure the mass fraction of the non-condensable gases remains low relative to the working fluid. This ensures that the thermal performance of the oscillating heat pipe 101 remains high. Working fluids such as R236fa, R1233zd, R245fa have suitably high vapour pressures at operating temperatures of the oscillating heat pipe 101.

The polymer that is used for the bendable region 301 of the oscillating heat pipe 101 can be selected so as to reduce interaction between the oscillating heat pipe 101 and the working fluid. The polymer can be selected to have a good chemical compatibility and low mass uptake with respect to the working fluid. The polymer that is used for the bendable region 301 can be weakly permeable to a high molecular weight working fluid. For instance, if R1233zd is used as the working fluid then suitable polymers for the bendable region 301 could comprise Epichlorohydrin rubber (ECO), Neoprene, silicone, or Butyl.

The polymer that is used for the bendable region 301 of the oscillating heat pipe 101 has sufficient tensile strength to avoid bursting of the oscillating heat pipe 101 as the bendable region 301 is folded and unfolded. The burst pressure for the bendable region 301 of the oscillating heat pipe 101 is given by:

$$\Delta p_{burst} = \frac{\sigma_T(r_o^2 - r_i^2)}{r_i^2\left(1 + \frac{r_o^2}{r_i^2}\right)},$$

where $\sigma_T$ is the tensile strength of the polymer used for the bendable region 301, $r_o$ is the outer radius of the oscillating heat pipe 101 in the bendable region 301 and $r_i$ is the inner radius of the oscillating heat pipe 101 in the bendable region 301.

Due to the small dimensions of the oscillating heat pipe 101 that would be used in examples of the disclosure the burst pressures can be very large. As an example Neoprene has $\sigma_T$~34.5 bar (Shore A 40 hardness), typical dimensions for the oscillating heat pipe 101 could be $r_o/r_i$=0.5 mm/0.2 mm and a safety factor of 3, this gives $\Delta p_{burst}/3$=8.3 bar. This compares favourably with R236fa saturation pressure of 6.7 bar at 55° C.

As the bendable region 301 of the oscillating heat pipe 101 could be weakly permeable to the working fluid the oscillating heat pipe 101 can be configured to reduce or minimize this fluid loss. For instance, in some examples the surface area of the bendable region 301 of the oscillating heat pipe 101 can be minimized. In some examples the oscillating heat pipe 101 can be overfilled to begin with so as to allow for a predictable, but acceptable, change in the thermal performance of the oscillating heat pipe 101 during the lifetime of the bendable electronic device 201. For instance, the initial charging ratio could be between 50 to 80% and could drop, over the lifetime of the bendable electronic device 201, to around 20% which would still provide an acceptable thermal performance.

Figure 6A:
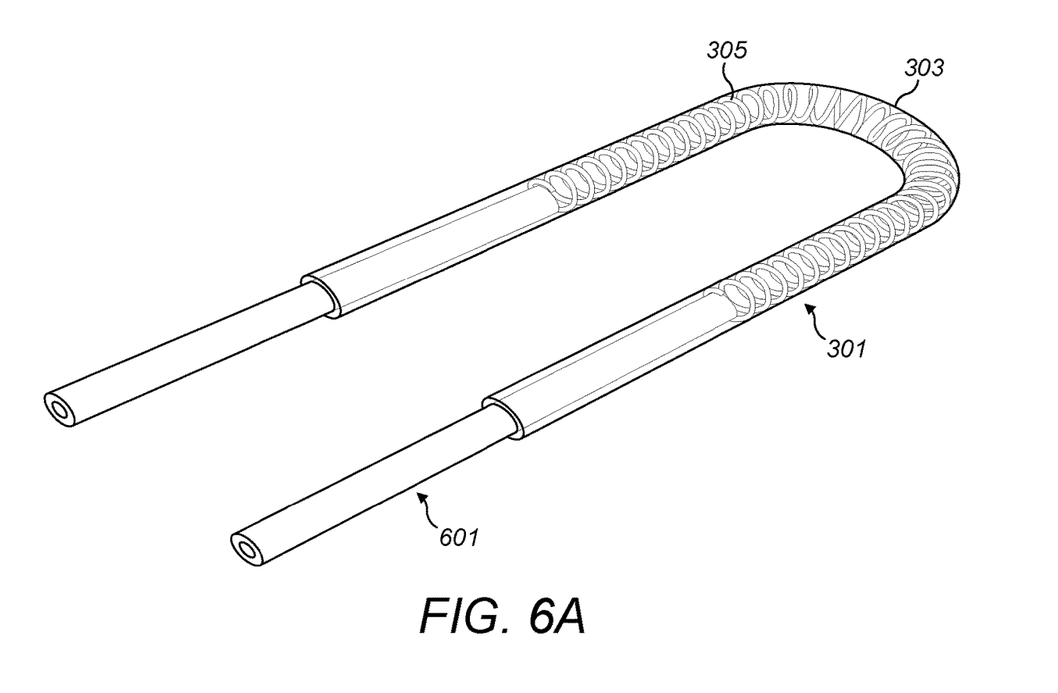
FIGS. 6A to 6B show a bendable region of an oscillating heat pipe and an electronic device.
Figure 6B:
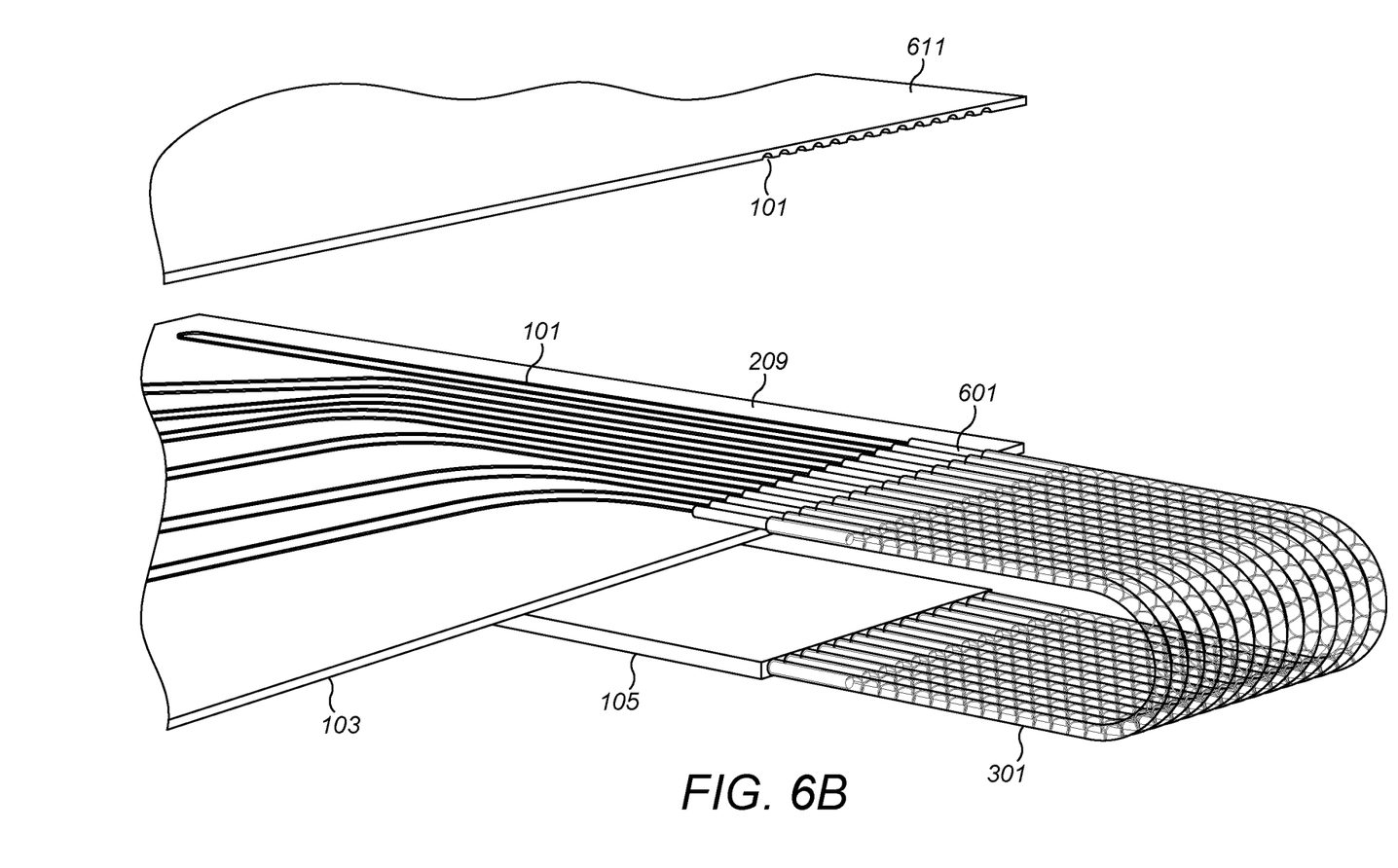

FIGS. 6A to 6B show a bendable region 301 of an oscillating heat pipe 101 and an electronic device 201 in more detail. The bendable region 301 is configured to allow for flow of the working fluid when the bendable electronic device 201 is in an open configuration and when the bendable electronic device 201 is in a closed configuration.

FIG. 6A shows an example of the bendable region of the oscillating heat pipe 101. The bendable region 301 comprises a polymer tubing 303 supported by a flexible helical support structure 305. The flexible helical support structure 305 is incorporated into the polymer tubing 303.

The polymer tubing 303 could be formed from any suitable type of polymer as discussed above.

The flexible helical support structure 305 can be formed from any suitable material such as a flexible metal, metal alloy or polymer. The polymer could be a non-elastomeric polymer. The helical support structure 305 can be embedded within the polymer tubing 303 or could be provided on an outer surface of the polymer tubing 303.

The helical support structure 305 can help to prevent kinking of the polymer tubing 303 as the bendable electronic device 201 is moved between open and closed configurations. Any kinks within the polymer tubing 303 would restrict the flow of working fluid through the oscillating heat pipe 101 and would degrade the thermal performance of the oscillating heat pipe 101.

In some examples the helical support structure 305 can have different configurations along the length of the oscillating heat pipe 101. For instance, the helical support structure 305 can be configured to have different pitches in different positions along the length of the oscillating heat pipe 101. In some examples the helical support structure 305 can be configured to allow for flexibility within the bending region 301 of the oscillating heat pipe 101 but could be configured to enhance rigidity of the polymer tubing 303 away from the bending region 301. This could facilitate connection of the polymer tubing 303 to rigid portions such as the condenser region 103 or evaporator region 105.

In some examples the oscillating heat pipe 101 could comprise means for increasing tensile strength and/or reducing elongation of the oscillating heat pipe 101. The means could comprise a longitudinal member that could be added to the oscillating heat pipe 101 outside of the bendable region 301. The longitudinal member could be provided in portions of the oscillating heat pipe 101 that are located on the rigid portions 209, 211 of the bendable electronic device 201.

The bendable region 301 also comprises coupling means 601 that enable the bendable region 301 to be coupled to the evaporator region 105 and the condenser region 103 of the oscillating heat pipe 101. In the example shown in FIG. 6A the coupling means 601 comprises an insert that can be fitted inside of a section of the condenser region 103 or evaporator region 105 so as to enable working fluid to flow between the bendable region 301 and the evaporator region 105 and condenser region 103. Other types of coupling means could be used in other examples of the disclosure.

FIG. 6B shows the bendable region 301 coupled to an evaporator region 105 and a condenser region 103 within an electronic device 201. The bendable region 301 comprises an array of polymer tubing 303 supported by flexible helical support structures 305.

A first coupling means 601 of the bendable region 301 is coupled to a condenser region 103 which is provided in a central rigid portion 209 of the electronic device 201 and a second coupling means 601 of the bendable region 301 is coupled to an evaporator region 105 which is provided in a rigid end portion 211 of the electronic device 201.

In the example shown in FIG. 6B the electronic device 201 also comprises a low profile vapour chamber 611. The low profile vapour chamber is thermally coupled to the condenser region 103 to enable heat to be transferred from the condenser region 103 to the low profile vapour chamber 611.

Figure 7:
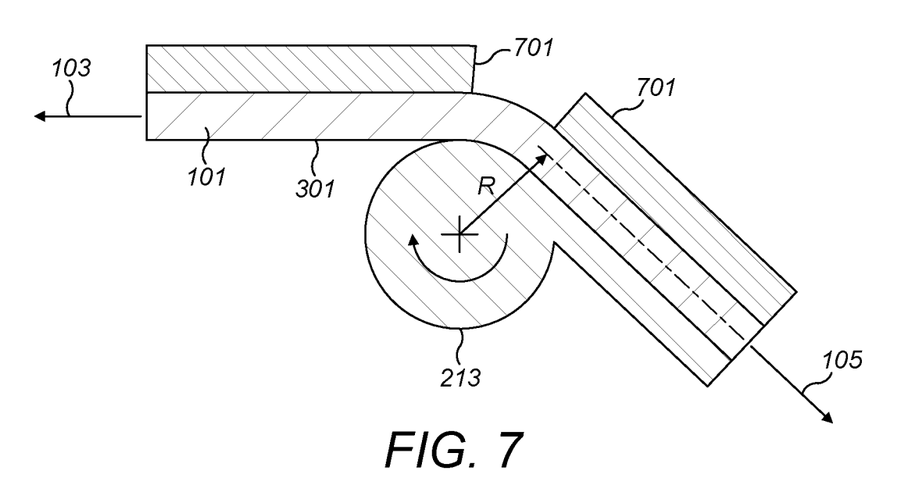
FIG. 7 shows a hinge of a bendable electronic device.

FIG. 7 shows an example hinge 213 that could be used in a bendable electronic device 201. The hinge 213 can be provided between two rigid portions of a bendable electronic device 201.

In FIG. 7 the hinge 213 is shown in a partially open configuration with the bendable region 301 of the oscillating heat pipe 101 positioned with a bend of approximately 45°. In some examples the bendable electronic device 201 could be used in such configurations, for example if the bendable electronic device 201 is a laptop or other device intended for viewing content.

In the example shown in FIG. 7 rigid support structures 701 are provided coupled to the oscillating heat pipe 101 on either side of the hinge 213. The support structures 701 are provided on either side of the hinge 213 and are configured to facilitate bending of the oscillating heat pipe 101 by controlling distribution of stress within the walls of the polymer tubing 303. The support structures 701 can help to reduce kinking within the oscillating heat pipe 101.

The bendable region 301 is positioned between the condenser region 103 and the evaporator region 105 of the oscillating heat pipe 101 as indicated by the arrows in FIG. 7.

The bendable region 301 of the oscillating heat pipe 101 is provided within the hinge 213 so that as the hinge 213 is opened and closed the bendable region 301 is also moved between an open and closed configuration. In the closed configuration the bendable region 301 within the hinge 213 could be bent to an angle of 180° so that parts of the oscillating heat pipe 101 double back on each other. In this configuration the two support structures 701 as shown in FIG. 7 would be stacked on top of each other with the hinge 213 and the oscillating heat pipe 101 between them.

In some examples the open configuration could be a partially open configuration as shown in FIG. 7 or a fully open configuration in which the oscillating heat pipe 101 is configured into a flat configuration with no bending across the hinge 213. In this configuration the support structures 701 as shown in FIG. 7 would be provided on the same plane.

Figure 8:
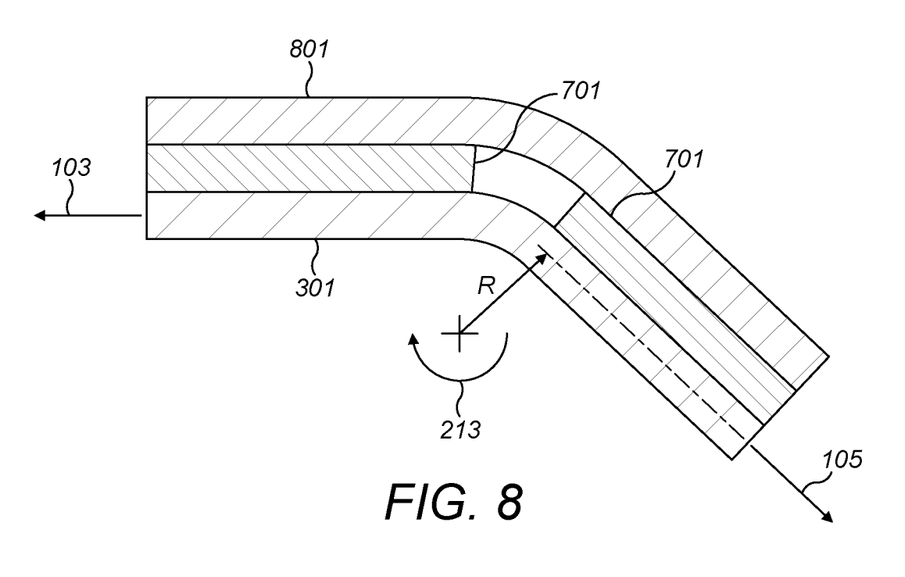
FIG. 8 shows a hinge of an electronic device.

FIG. 8 shows another example hinge 213 that could be used within a bendable electronic device 201. In this example the support structures 701 mechanically couple the oscillating heat pipe 101 to the rear side of a flexible display 801. In such examples the oscillating heat pipe 101 would have a larger curvature (smaller bending radius) than the flexible display when the bendable electronic device 201 is in the closed configuration. This large curvature can be possible due to the helical support structure 305 which provides for superior mechanical behavior of the oscillating heat pipe 101 compared to the flexible display 801.

Examples of the disclosure therefore provide an oscillating heat pipe 101 that is suitable for use in bendable electronic devices 201. The oscillating heat pipe 101 is compact and so can fit into small sized bendable electronic devices 201 while still providing high heat carrying capacity.

The oscillating heat pipe 101 can function in any orientation so the oscillating heat pipe 101 is suitable for use in portable electronic devices such as mobile phones or tablets which could be used in different orientations at different times.

The oscillating heat pipe 101 can be designed into any suitable configuration so that the oscillating heat pipe 101 can be coupled to a plurality of different heat sources in a plurality of different locations and can also be configured to spread the heat over a large surface area.

Figure 9:
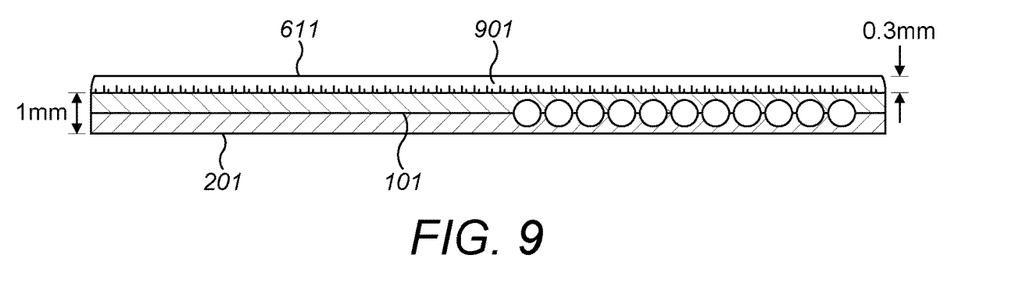
FIG. 9 shows a cross section of a condenser region.

FIG. 9 shows a cross section of a condenser region 103. The condenser region could be provided within a rigid portion of an electronic device 201 such as the electronic device 201 shown in FIG. 6B. The condenser region 103 comprises a rigid portion of an oscillating heat pipe 101. The rigid portion of the oscillating heat pipe 101 is thermally coupled to a low profile vapour chamber 611. In the example shown in FIG. 9 the oscillating heat pipe 101 has a height of approximately 1 mm and the low profile vapour chamber 611 has a height of approximately 0.3 mm. The low profile vapour chamber 611 has a height which is less than half the height of the oscillating heat pipe 101. It is to be appreciated that other dimensions and relative sizes could be used for the respective components in other examples of the disclosure.

The rigid portion of the oscillating heat pipe 101 is thermally coupled to the low profile vapour chamber 611 so that heat can be transferred from the rigid portion of the oscillating heat pipe 101 to the low profile vapour chamber 611. In the example shown in FIG. 9 the low profile vapour chamber 611 comprises a wick structure 901 to enable a working fluid within the low profile vapour chamber 611 to transfer heat away from the condenser region of the oscillating heat pipe 101.

In the example shown in FIG. 9 the rigid portion of the oscillating heat pipe 101 can also act as a stiffener which can provide a mechanical support for the low profile vapour chamber 611. This can help to prevent unwanted bending or deformation of the low profile vapour chamber 611 and other components within the electronic device 201, such as the display.

Figure 10:
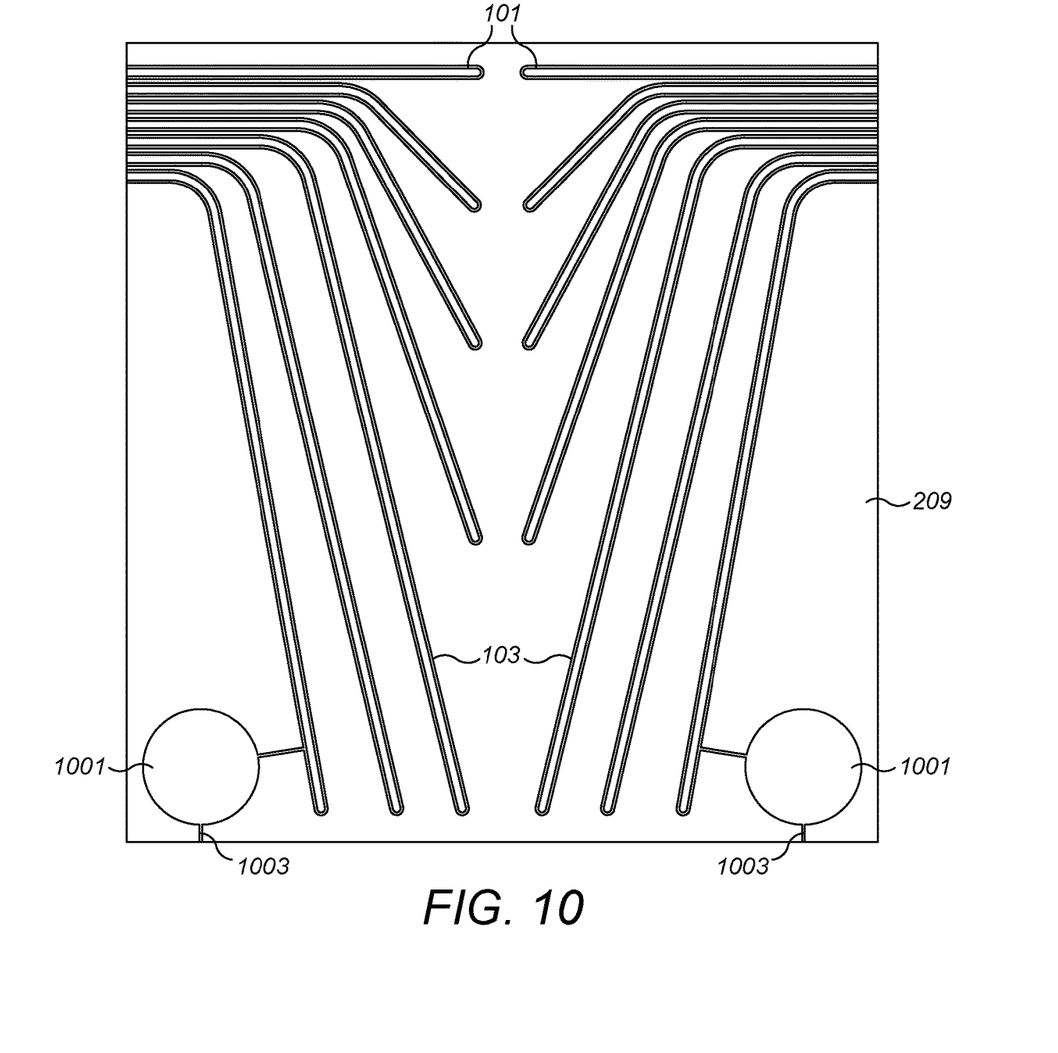
FIG. 10 shows a plan view of a condenser region

FIG. 10 shows a plan view of condenser regions 103 of two oscillating heat pipes 101. These condenser regions 103 could be provided within a central rigid portion 209 of an electronic device 201 such as the electronic device 201 shown in FIGS. 2A to 2C. The rigid end portions 211 are not shown in FIG. 10. It is to be appreciated that the left hand side condenser region 103 would be coupled to an evaporator region 105 in a rigid end portion on the left hand side of the electronic device 201 and the right hand side condenser region 103 would be coupled to an evaporator region 105 on the right hand side of the electronic device 201.

The condenser regions 103 are spread out over the area of the central rigid portion 209. This spreading out of the condenser regions helps to improve the thermal efficiency of the oscillating heat pipe 101.

In the example shown in FIG. 10 the oscillating heat pipe 101 comprises a reservoir 1001 that is configured to store working fluid for refilling the oscillating heat pipe 101. The reservoir 1001 can be fluidically coupled to the oscillating heat pipe 101, by a channel or any other suitable means, so that when the oscillating heat pipe 101 is being refilled fluid can flow from the reservoir into the oscillating heat pipe 101.

The reservoir 1001 could be located in any suitable position within the bendable electronic device 201. The reservoir 1001 could be thermally isolated from the oscillating heat pipe 101 and from electronic components within the bendable electronic device 201 so that the working fluid within the reservoir 1001 is not heated by these components. A separate heat source can be provided to enable the reservoir to be heated so as to create a pressure differential between the fluid within the reservoir 1001 and the fluid within the oscillating heat pipe 101. In such cases the reservoir 1001 and the heat source are thermally isolated from other components of the electronic device 201 so that the heat from the heat source is provided to the working fluid stored in the reservoir 1001 and not to other components within the electronic device 201.

In the example of FIG. 10 the reservoir 1001 is located on the same rigid portion of the bendable electronic device 201 as the condenser region 103. In the example bendable electronic device 201 of FIG. 10 the reservoir 1001 is located on the central rigid portion 209 where there may be more space for additional components and it is easier to thermally isolate the reservoir for improved or maximum performance.

In some examples the oscillating heat pipe 101 can be configured so that it can be automatically refilled from the reservoir 1001 when the working fluid within the oscillating heat pipe 101 drops below a threshold level. In such examples the oscillating heat pipe 101 can comprise at least one sensor configured to sense a filling level of the working fluid within the oscillating heat pipe 101. In some examples the sensors could be temperature sensors that could be configured to record the skin temperature of the bendable electronic device 201 and the temperature of one or more of the heat sources. These temperature measurements could provide an indication of a drop in thermal performance of the oscillating heat pipe 101 which could provide an indication of loss of working fluid from the oscillating heat pipe 101.

The one or more sensors could be coupled to a controller, such as a processor unit 203, which could be configured to control refilling of the oscillating heat pipe 101 from the reservoir based on a signal from at least one sensor. In such examples, if the sensor senses that the working fluid within the oscillating heat pipe 101 has dropped below a threshold level, such as a filling ratio of 20%, then the controller will provide a control signal to enable working fluid to flow from the reservoir into the oscillating heat pipe 101.

In order to enable the oscillating heat pipe 101 to be refilled the controller can control the bendable electronic device 201 to be turned off or to operate at a reduced capacity so as to minimize the internal pressure within the oscillating heat pipe 101. The controller then causes an increase in pressure within the reservoir to force the working fluid into the oscillating heat pipe 101. The pressure of the reservoir 1001 could be increased by heating the reservoir 1001 or by any other suitable means. It is to be appreciated that other means for controlling the flow of working fluid from the reservoir 1001 into the oscillating heat pipe 101 could be used in other examples of the disclosure.

Each of the reservoirs 1001 comprise a fill port 1003. This enables the working fluid within the reservoir 1001 to be refilled when appropriate.

In the example shown in FIG. 10 each of the oscillating heat pipes 101 has a separate reservoir 1001. In other examples a single reservoir 1001 could be coupled to more than one oscillating heat pipe 101.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. A heat pipe, comprising:
   at least one condenser region configured to be positioned in a first portion of a bendable electronic device;
   at least one evaporator region configured to be positioned in a second portion of the bendable electronic device, wherein the at least one evaporator region is positioned proximate at least one of a battery or a processor on the second portion of the bendable electronic device; and at least one bendable region provided between the at least one condenser region and the at least one evaporator region, wherein the at least one bendable region is positioned proximate a flexible display of the bendable electronic device, the at least one bendable region being configured to extend across a hinge between a rigid portion of the first portion of the bendable electronic device and a rigid portion of the second portion of the bendable electronic device, wherein the at least one bendable region between the at least one condenser region and the at least one evaporator region has a smaller bending radius than a bending radius of the flexible display when the bendable electronic device is in a closed position, and wherein the at least one bendable region comprises a polymer tubing supported by a flexible helical support structure embedded into the polymer tubing such that the bendable electronic device is foldable to an angle of one hundred eighty degrees such that the first portion of the bendable electronic device is positionable on the second portion of the bendable electronic device.

2. The heat pipe as claimed in claim 1 further comprising a working fluid wherein the heat pipe is configured to cause an oscillation of the working fluid within the heat pipe.

3. The heat pipe as claimed in claim 2 wherein the working fluid within the heat pipe has a confinement number less than one, wherein the confinement number is given by $Co=l_c/2r_i$, where $l_c=\sqrt{\{\text{square root over }(\gamma/(g\Delta\rho))\}}$ is a capillary length, $\gamma$ is a surface tension of the working fluid, g is an acceleration due to gravity, $\Delta\rho$ is a density difference between a liquid phase and a vapour phase of the working fluid, and $r_i$ is an inner radius of the heat pipe.

4. The heat pipe as claimed in claim 2 wherein the working fluid within the heat pipe comprises fluorine.

5. The heat pipe as claimed in claim 2 wherein the working fluid within the heat pipe has a vapour pressure high enough to reduce effects of ingress of non-condensable gases into the heat pipe.

6. The heat pipe as claimed in claim 2 wherein the polymer tubing is formed from a polymer configured to reduce interaction with the working fluid in the heat pipe.

7. The heat pipe as claimed in claim 1 wherein the flexible helical support structure comprises at least one of; a metal, a metal alloy, or a polymer.

8. The heat pipe as claimed in claim 1 wherein the at least one evaporator region is configured to be thermally coupled to at least one of; an electronic component including the processor, a vapour chamber, a heat spreader, a solid-state heat spreader, or a second heat pipe.

9. The heat pipe as claimed in claim 1 wherein the at least one condenser region is configured to be thermally coupled to at least one of; a heat spreader, or a vapour chamber.

10. The heat pipe as claimed in claim 1 wherein the at least one condenser region and the at least one evaporator region of the heat pipe comprise respective non-bending materials.

11. The heat pipe as claimed in claim 1 comprising at least one reservoir coupled to the heat pipe and configured to store the working fluid for refilling the heat pipe.

12. The heat pipe as claimed in claim 11 comprising at least one sensor configured to sense a filling level of the working fluid within the heat pipe and at least one controller configured to control the refilling of the heat pipe from the reservoir based on a signal from the at least one sensor.

13. The heat pipe as claimed in claim 1 wherein the at least one bendable region of the heat pipe is provided across the hinge between the rigid portion of the first portion of the bendable electronic device and the rigid portion of the second portion of the bendable electronic device.

14. A bendable electronic device comprising a hinge; and one or more heat pipes comprising:
at least one condenser region configured to be positioned in a first portion of the bendable electronic device;
at least one evaporator region configured to be positioned in a second portion of the bendable electronic device, wherein the at least one evaporator region is positioned proximate at least one of a battery or a processor on the second portion of the bendable electronic device; and
at least one bendable region provided between the at least one condenser region and the at least one evaporator region, wherein the at least one bendable region is positioned proximate a flexible display of the bendable electronic device and is configured to extend across the hinge of the bendable electronic device, wherein the at least one bendable region between the at least one condenser region and the at least one evaporator region has a smaller bending radius than a bending radius of the flexible display when the bendable electronic device is in a closed position, and wherein the at least one bendable region comprises a polymer tubing supported by a flexible helical support structure embedded into the polymer tubing such that the bendable electronic device is foldable to an angle of one hundred eighty degrees such that the first portion of the bendable electronic device is positionable on the second portion of the bendable electronic device.

15. The bendable electronic device as claimed in claim 14 wherein the flexible helical support structure comprises at least one of; a metal, a metal alloy, or a polymer.

16. The bendable electronic device as claimed in claim 14 wherein the at least one evaporator region is configured to be thermally coupled to at least one of; an electronic component including the processor, a vapour chamber, a heat spreader, a solid-state heat spreader, or at least one of the one or more heat pipes.

17. The bendable electronic device as claimed in claim 14 wherein the at least one condenser region is configured to be thermally coupled to at least one of; a heat spreader, or a vapour chamber.

18. The bendable electronic device as claimed in claim 14 further comprising a working fluid wherein the bendable electronic device is configured to cause an oscillation of the working fluid within at least one of the one or more heat pipes.

19. The bendable electronic device as claimed in claim 18 wherein the working fluid within the one or more heat pipes has a confinement number less than one, wherein the confinement number is given by $Co=l_c/2r_i$, where $l_c=\sqrt{\{\text{square root over }(\gamma/(g\Delta\rho))\}}$ is a capillary length, $\gamma$ is a surface tension of the working fluid, g is an acceleration due to gravity, $\Delta\rho$ is a density difference between a liquid phase and a vapour phase of the working fluid, and $r_i$ is an inner radius of the one or more heat pipes.

20. A method, comprising:
positioning at least one condenser region in a first portion of a bendable electronic device;
positioning at least one evaporator region in a second portion of the bendable electronic device, wherein the at least one evaporator region is positioned proximate at least one of a battery or a processor on the second portion of the bendable electronic device; and
providing at least one bendable region between the at least one condenser region and the at least one evaporator region, wherein the at least one bendable region is positioned proximate a flexible display of the bendable electronic device, the at least one bendable region extending across a hinge of the bendable electronic device, wherein the at least one bendable region extending across the hinge has a smaller bending radius than a bending radius of the flexible display when the bendable electronic device is in a closed position, and the at least one bendable region being formed from a polymer tubing supported by a flexible helical support structure embedded into the polymer tubing such that the bendable electronic device is foldable to an angle of one hundred eighty degrees such that the first portion of the bendable electronic device is positionable on the second portion of the bendable electronic device.

* * * * *